US009629232B2

(12) United States Patent
Reilly et al.

(10) Patent No.: US 9,629,232 B2
(45) Date of Patent: Apr. 18, 2017

(54) THERMALLY ACTUATED PRINTED CIRCUIT BOARD RETAINERS

(71) Applicant: The Regents of the University of California, Oakland, CA (US)

(72) Inventors: Sean Reilly, Los Angeles, CA (US); Jacob Supowit, Valencia, CA (US); Michael J. Stubblebine, Los Angeles, CA (US)

(73) Assignee: The Regents of the University of California, Oakland, CA (US)

( * ) Notice: Subject to any disclaimer, the term of this patent is extended or adjusted under 35 U.S.C. 154(b) by 304 days.

(21) Appl. No.: 13/897,336

(22) Filed: May 17, 2013

(65) Prior Publication Data
US 2013/0343004 A1     Dec. 26, 2013

Related U.S. Application Data

(60) Provisional application No. 61/648,459, filed on May 17, 2012.

(51) Int. Cl.
*H05K 1/02*       (2006.01)
*H05K 7/14*       (2006.01)
*H05K 7/20*       (2006.01)

(52) U.S. Cl.
CPC ........ *H05K 1/0201* (2013.01); *H05K 1/0203* (2013.01); *H05K 7/1404* (2013.01); *H05K 7/2039* (2013.01); *H05K 2201/068* (2013.01)

(58) Field of Classification Search
CPC ... H05K 1/0201; H05K 1/0203; H05K 7/1404
(Continued)

(56) References Cited

U.S. PATENT DOCUMENTS 3,939,382 A * 2/1976 Lacan ................. H05K 7/1405
                                                   211/41.17
4,414,605 A * 11/1983 Chino ................. H05K 7/1404
                                                   361/707
(Continued)

FOREIGN PATENT DOCUMENTS

EP           289686 A1 * 11/1988  ............... H05K 7/20
EP        0289686 A1 * 11/1988  ........... H05K 7/1404

OTHER PUBLICATIONS

Rostra Vernatherm "Thermal Acutator", retrieved from http://rostravernatherm.thamasnet.com/item/all-categories/thermal-actuators/pn-1020?&plpver=10&assetid=a1017.
(Continued)

*Primary Examiner* — Zachary M Pape
*Assistant Examiner* — Amir Jalali
(74) *Attorney, Agent, or Firm* — KPPB LLP

(57) ABSTRACT

Thermally actuated printed circuit board (PCB) retainer assemblies that utilize at least one thermally actuated element to secure a received PCB to a heat sink in accordance with embodiments of the invention are disclosed. In one embodiment, a thermally actuated PCB retainer assembly includes a heat sink having an elongated groove configured to receive a PCB and a PCB retainer that includes a pair of complementary elongated bodies each having a first elongated face and a second elongated face where the second elongated faces of the elongated bodies are disposed in a cooperative sliding relation and at least one thermally actuated element in contact with at least one of the elongated bodies such that the thermally actuated element applies a force on the at least one elongated body in response to temperature changes such that the elongated bodies move in the cooperative sliding relation.

19 Claims, 9 Drawing Sheets

(58) Field of Classification Search
USPC ....... 361/720, 704, 710, 715, 721, 740, 741, 361/747, 754, 759, 756, 801, 802; 403/373–374.5, 409.1; 411/79
See application file for complete search history.

(56) References Cited

U.S. PATENT DOCUMENTS

| | | | | |
|---|---|---|---|---|
| 4,480,287 | A * | 10/1984 | Jensen | H05K 7/1404 361/707 |
| 4,775,260 | A * | 10/1988 | Kecmer | F16B 2/14 361/801 |
| 4,821,147 | A * | 4/1989 | Jacobs | H05K 7/20545 211/41.17 |
| 4,899,543 | A * | 2/1990 | Romanelli | F03G 7/065 294/103.1 |
| 4,953,059 | A * | 8/1990 | McNulty | H05K 7/1404 165/80.3 |
| 5,036,428 | A * | 7/1991 | Brownhill | H05K 7/1404 165/80.1 |
| 5,211,496 | A * | 5/1993 | Hurowitz | F16B 5/0614 361/759 |
| 5,220,485 | A * | 6/1993 | Chakrabarti | H05K 7/1404 165/185 |
| 5,290,122 | A * | 3/1994 | Hulme | H05K 7/1404 165/80.2 |
| 5,472,353 | A * | 12/1995 | Hristake | H05K 7/1404 361/709 |
| 5,483,420 | A * | 1/1996 | Schiavini | H05K 7/1404 211/41.17 |
| 5,485,353 | A * | 1/1996 | Hayes | H05K 7/1404 165/185 |
| 5,600,540 | A * | 2/1997 | Blomquist | H01L 23/4093 174/16.3 |
| 5,607,273 | A * | 3/1997 | Kecmer | H05K 7/1404 411/24 |
| 5,711,628 | A * | 1/1998 | Fletcher | F16B 2/04 403/31 |
| 6,675,610 | B2 * | 1/2004 | Beard | A44C 27/003 63/3 |
| 7,483,271 | B2 * | 1/2009 | Miller | H05K 7/1404 165/80.2 |
| 7,814,810 | B2 * | 10/2010 | Mitteer | F16H 61/22 192/220.2 |
| 7,883,289 | B2 * | 2/2011 | Weisman | H05K 7/1407 403/374.4 |
| 8,276,655 | B2 * | 10/2012 | Chu | H01L 23/367 165/185 |
| 2002/0076974 | A1 * | 6/2002 | Peterson | H01R 12/82 439/485 |
| 2006/0013683 | A1 * | 1/2006 | Martindale | F01D 25/24 415/191 |
| 2006/0180926 | A1 * | 8/2006 | Mullen | H01L 23/4093 257/727 |
| 2008/0024991 | A1 * | 1/2008 | Colbert | H01L 23/4093 361/704 |
| 2011/0103784 | A1 * | 5/2011 | Hashizume | G02B 7/08 396/133 |
| 2012/0160449 | A1 * | 6/2012 | Fowler | H05K 7/20509 165/80.2 |
| 2013/0003316 | A1 * | 1/2013 | Martin | 361/720 |
| 2013/0343004 | A1 * | 12/2013 | Reilly | H05K 1/0201 361/720 |

OTHER PUBLICATIONS

Birtcher, "Rugged Printed Circuit Board Hardware", 2010 Edition, vol. 2, 96 pgs.
Birtcher, "Wedge-Lok Three-piece", Birtcher, n.d. Web May 10, 2012, retrieved from http://www.birtcherproducts.com/default.asp?section=2&page=3piece/default.
Calmark, "Card-Lok" Dec. 7, 2011 from Retainer (Ejector) data sheet, Series E225, retrieved Dec. 7, 2011 from http://www.calmark.com/pdfs/e225.pdf.
Calmark, "Schroff Series 225 Card Lok", http://www.pentairprotect.com.
Calmark, "Thermal Resistance—Card Loks", retrieved from http://www.calmark.com/pdfs/trd.pdf.
Jensen, Moses, "Wedgelock Introduction", Wakefield Solutions. Intro to Wedgelocks. Wakefield Solutions, 2011.
Memtry, A Saes Group Company, "Nitinol Fundamentals", retrieved from http://www.memry.com/nitinol-ig/nitinol-fundamentals.
Microdevices, Sirenza, "Reliability Qualification Report", Sirenza Micodevices, 7 pgs., n.d., retrieved May 11, 2012 from http://www.rfmd.com/CS/Documents/SGL-0163_Qualification_Report_63_Package.pdf.
Solutions, Wakefield, "Wedgelocks", Wakefield Solutions. Digital Image. Wedgelocks. Wakefield Solutions, n.d. Web May 10, 2012, retrieved from http://www.wakefield.com/TechnicalProducts/Wedgelocks/tabid/69/Default.aspx.
Technologies, Avago, "Reliability Data Sheet", Avago Technologies, n.p., n.d. Retrieved May 10, 2012 from http://www.ebv.com/fileadmin/products/Products/Avago/ASMT-Ax3x/AV02-2443EN.pdf.
Avago Technologies, Reliability Data Sheet, Avago Technologies, n.p., n.d., Web, May 10, 2012, http://www.ebv.com/fileadmin/products/Products/Avago/ASMT-Ax3x/AV02-2443EN.pdf.
Birtcher, Digital image, Birtcher Products: Wedge-Lok Three-piece, Birtcher, n.p., n.d., Web, May 10, 2012, http://www.birtcherproducts.com/default.asp?section=2&page=3piece/default.
Birtcher, Digital image, Electro-Mechanical Components and Accessories, Birtcher, n.p. n.d., Web, May 10, 2012, http://www.birtcherproducts.com/pdf/Cat-00044.pdf.
Calmark "Card-Lok" Retainer (ejector) data sheet, Retrieved Dec. 7, 2011, from http://calmark.com/pdfs/e225.pdf.
Sirenza Microdevices, Reliability Qualification Report, Sirenza Microdevices, n.p., n.d., Web, May 11, 2012, http://www.rfmd.com/CS/Documents/SGL-0163_Qualification_Report_63_Package.pdf.
Wakefield Solutions, Digital Image, Wedgelocks. Wakefield Solutions, n.d. Web, May 10, 2012, http://www.wakefield-vette.com/products/accessories/wedgelocks.aspx.
"Intro to Wedgelocks", Wakefield Solutions, n.d., web, May 10, 2012, http://www.wakefield.com/LinkClick.aspx?fileticket=RdIntciVUDU%3D&tabid=69.
"Nitinol Fundamentals", Memry, Web, May 8, 2012, http://www.memry.com/nitinol-iq/nitinol-fundamentals.
"Thermal Actuator", Rostra Vernatherm, Retrieved Dec. 7, 2011, from http://rostravernatherm.thomasnet.com/item/all-categories/thermal-actuators/pn-1020?plpver=10&assetid=a1017.
"Thermal Resistance—Card-Loks", Calmark, http://www.calmark.com/pdfs/trd.pdf.

* cited by examiner

US 9,629,232 B2

THERMALLY ACTUATED PRINTED CIRCUIT BOARD RETAINERS

CROSS-REFERENCE TO RELATED APPLICATIONS

This application claims priority to U.S. Provisional Patent Application No. 61/648,459, titled Autonomous Thermal Connector, filed May 17, 2012, the content of which is incorporated herein by reference.

GOVERNMENT SUPPORT

This invention was made with Government support under Grant No. N00014-12-1-0397, awarded by the U.S. Navy, Office of Naval Research. The Government has certain rights in this invention.

FIELD OF THE INVENTION

The present invention generally relates to printed circuit board retainers and more specifically to heat dissipating temperature actuated printed circuit board retainer assemblies.

BACKGROUND

A printed circuit board (PCB) includes various electronic components that are electrically connected and mounted onto a non-conductive substrate. A PCB's dimensions can be designed based on the required circuitry for a particular application. Generally, the mounted electronics have optimal operating temperature ranges and significant performance loss can result when temperatures reach above the range. In many applications, high temperatures can be caused by the surrounding environment and/or from the electronics themselves since the electronic components generate heat when utilized.

A system architecture can include multiple PCBs depending on the needs and/or preferences of the end user. The multiple PCBs are usually housed in the same case and placed in close proximity to each other. As such, PCB dimensions are often standardized to be mounted in racks like books on a shelf where each rack can contain multiple PCBs. In consideration of temperature regulation, the racks can incorporate cold plates that act as heat sinks to transfer heat away from the PCBs. In many applications, the PCBs are secured into the racks with so-called wedge locks. The "Card-Lok" Retainer, created by Calmark Corporation of San Diego, Calif., is one type of wedge lock. Typically, wedge locks contain a long screw that passes through a series of opposing wedges (commonly 3 to 5 wedges) that are assembled onto a threaded mounting bar. A rear wedge is threaded and fixed and a screw is threaded into the front of the mounting bar such that upon actuation (turning the screw) the screw head pushes the front wedge rearward and pulls the rear wedge forward securing the PCB to the cold plate.

SUMMARY OF THE INVENTION

Thermally actuated printed circuit board (PCB) retainer assemblies that utilize at least one thermally actuated element to secure a received PCB to a heat sink in accordance with embodiments of the invention are disclosed. In one embodiment, a thermally actuated PCB retainer assembly includes a heat sink having an elongated groove having first and second elongated walls configured to receive a printed circuit board and a printed circuit board retainer that includes a pair of complementary elongated bodies each having a first elongated face and a second elongated face where the second elongated faces of the elongated bodies are disposed in a cooperative sliding relation and at least one thermally actuated element in contact with at least one of the elongated bodies such that the thermally actuated element applies a force on the at least one elongated body in response to temperature changes such that the elongated bodies move in the cooperative sliding relation.

In a further embodiment, the heat sink having an elongated groove also includes a third elongated wall.

In another embodiment, the PCB retainer includes two thermally actuated elements.

In a still further embodiment, the PCB retainer includes a first and second side support beams.

In still another embodiment, the first and second side support beams are integral with the first elongated body.

In a yet further embodiment, the PCB retainer includes a first and second side support beams that are separate structures attached to the first elongated body.

In a further embodiment again, the thermally actuated elements are attached to the side support beams.

In another embodiment again, the at least one thermally actuated element is made of materials that exhibit shape memory.

In a further additional embodiment, the at least one thermally actuated element is made of materials that exhibit superelasticity.

In another additional embodiment, the at least one thermally actuated element is made using Nickel Titanium.

In a still yet further embodiment, the first and second elongated bodies are made of Aluminum.

In still yet another embodiment, the PCB retainer has a dis-engaged configuration when the at least one thermally actuated element is below its transition temperature.

In a still further embodiment again, the PCB retainer has an engaged configuration when the at least one thermally actuated element reaches its transition temperature.

In still another embodiment again, the received PCB includes electronic components that generate heat when the electronic components are utilized.

In a still further additional embodiment, the at least one thermally actuated element has a transition temperature of 30+/−5 degrees Celsius.

In still another additional embodiment, the at least one thermally actuated element has a transition temperature greater than 25 degrees Celsius.

In a yet further embodiment again, the at least one thermally actuated element has a transition temperature greater than 30 degrees Celsius.

In yet another embodiment again, the at least one thermally actuated element has a transition temperature greater than 35 degrees Celsius.

In a yet further additional embodiment, the PCB retainer utilizes a single thermally actuated element.

In a further additional embodiment, an actuated PCB retainer assembly includes a heat sink having an elongated groove having first and second elongated walls configured to receive a printed circuit board, and a printed circuit board retainer including a pair of complementary elongated bodies each having a first elongated face and a second elongated face disposed opposite said first elongated face, wherein the second elongated face of each elongated body is angled relative to the first elongated face, and wherein the second elongated faces of the elongated bodies are disposed in a cooperative sliding relation such that movement of the second elongated faces relative to each other causes the first elongated faces of the elongated bodies to move laterally apart, and wherein the first elongated face of the first elongated body is in contact with the printed circuit board and wherein the first face of the second elongated body is in contact with the second elongated wall of the groove, and at least one spring loaded element in contact with at least one of the elongated bodies such that the spring loaded element applies a force on the at least one elongated body such that the elongated bodies move in the cooperative sliding relation.

DETAILED DISCLOSURE OF THE INVENTION

Turning now to the drawings, thermally actuated printed circuit board (PCB) retainer assemblies that utilize at least one thermally actuated element to secure a received PCB to a heat sink are illustrated. In many embodiments, the assembly includes a PCB retainer and a heat sink that includes a groove capable of receiving the edge of a PCB. In several embodiments, the PCB retainer includes at least one thermally actuated element that has a transition temperature as further discussed below. In various embodiments, the thermally actuated element has a first and second position that it transitions between depending on the temperature experienced by the thermally actuated element and its predetermined transition temperature.

In several embodiments, the PCB retainer includes a pair of complementary elongated bodies that slide against each other in a cooperative sliding relation as further discussed below. In many embodiments, the PCB retainer has a dis-engaged configuration such that the PCB can be more easily removed from the heat sink groove. In several embodiments, the PCB retainer has an engaged configuration such that the PCB is more securely retained within the groove of the heat sink. In various embodiments, the configuration depends on whether the thermally actuated element is below or above (or equal) to its transition temperature.

Heat Sink Designs

Figure 1:
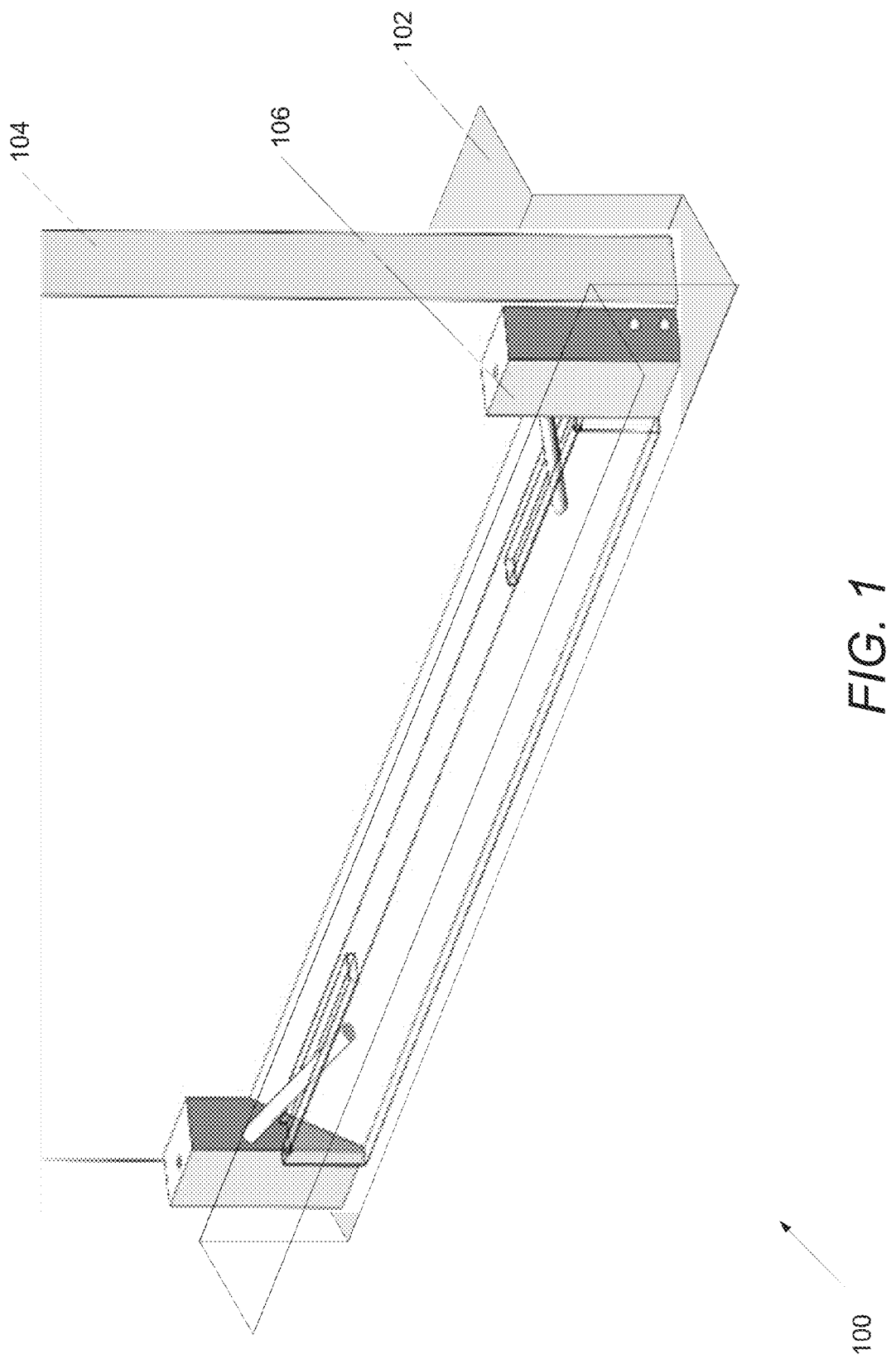
FIG. 1 illustrates a front perspective view of a thermally actuated printed circuit board (PCB) assembly including a heat sink, PCB, and PCB retainer in accordance with an embodiment of the invention.

Thermally actuated PCB retainer assemblies in accordance with many embodiments of the invention include a heat sink having an elongated groove for receiving a PCB. A thermally actuated PCB retainer assembly 100 in accordance with an embodiment of the invention is illustrated in FIG. 1. The thermally actuated PCB retainer assembly includes a PCB retainer 106 and a heat sink 102 that is capable of receiving a PCB. The received PCB 104 is secured in place with the PCB retainer 106 that has an engaged and dis-engaged configurations as further discussed below.

Figure 2:
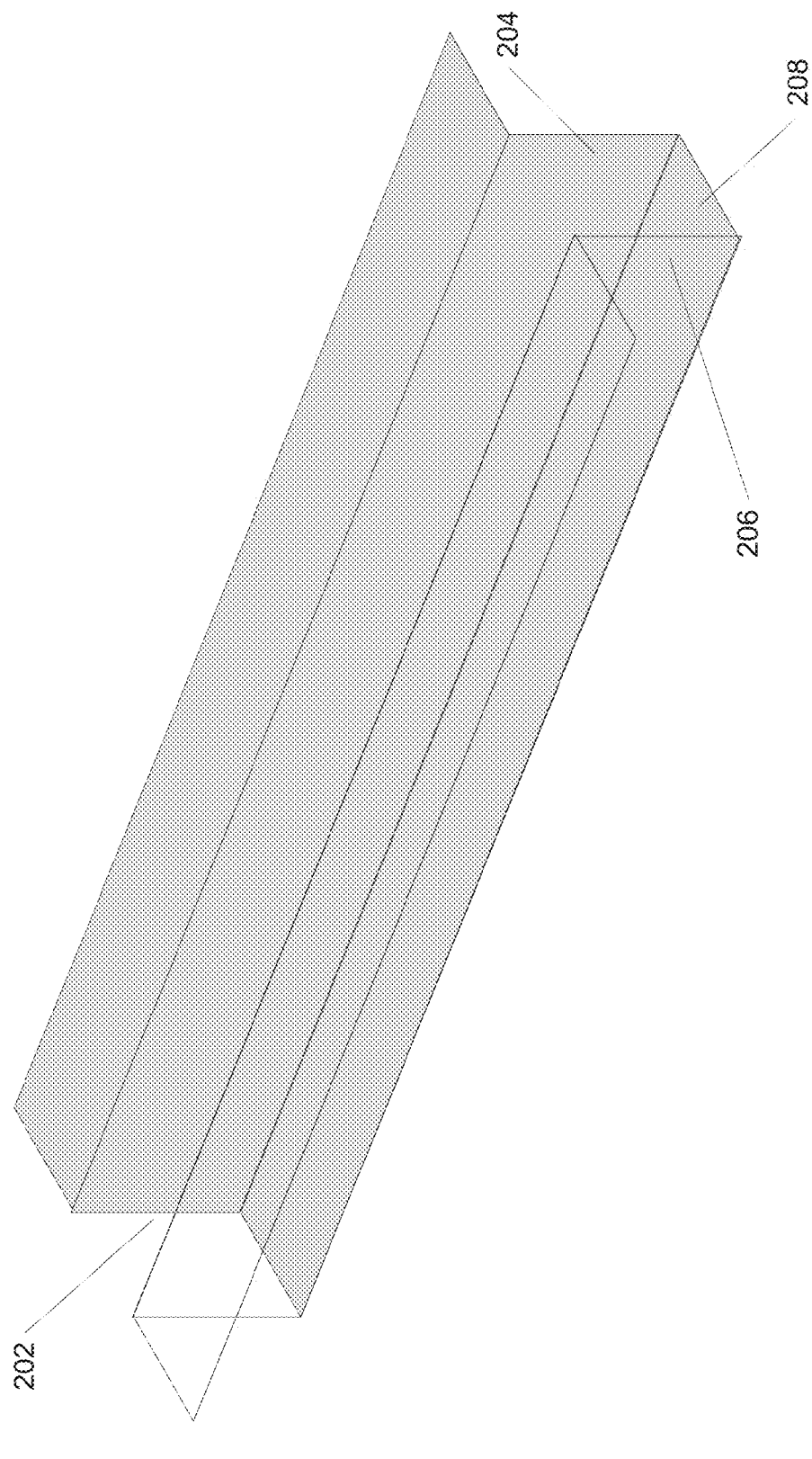
FIG. 2 illustrates a front perspective view of a heat sink including a groove created by a first and second elongated wall in accordance with an embodiment of the invention.

Referring to FIG. 2, the heat sink 102 includes a first elongated wall 204 and a second elongated wall 206 that creates a groove 202. In some embodiments, the heat sink 102 can also include a third elongated wall 208. In various embodiments, the heat sink is configured such that the groove can receive one end of a PCB. Although a specific heat sink is discussed above with respect to FIG. 2, any of a variety of heat sinks including heat sinks with a number of different groove shapes can be utilized in accordance with embodiments of the invention.

PCB Retainer Designs Utilizing Two Thermally Actuated Elements

Figure 3:
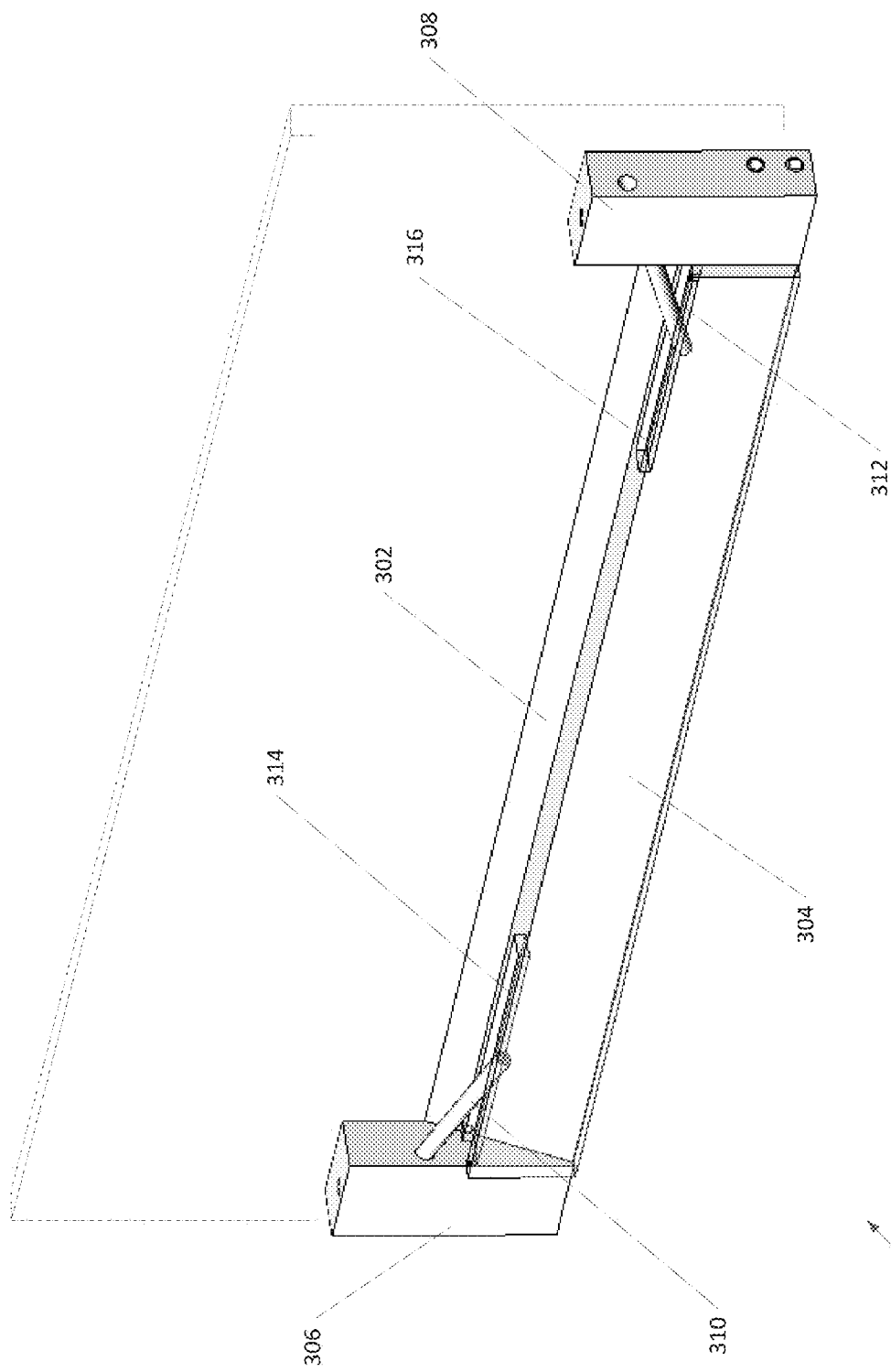
FIG. 3 illustrates a front perspective view of a PCB retainer utilizing two thermally actuated elements in accordance with an embodiment of the invention.

A PCB retainer can be designed utilizing various numbers and shapes of thermally actuated elements. A PCB retainer utilizing two thermally actuated elements in accordance with an embodiment of the invention is illustrated in FIG. 3. The PCB retainer 106 includes a first elongated body 302 and a second elongated body 304 that move in a cooperative sliding relation as further discussed below. In various embodiments, the PCB retainer includes a first 306 and second 308 side support beams that are attached to the first elongated body 302. The support beams can be various sizes or shapes. Further, the support beams can be incorporated into the first elongated body 302 as an included structure or separate structures merely attached to the first elongated body 302, depending on the requirements of a specific application.

In many embodiments, the thermally actuated elements are attached to the side support beams. Referring again to FIG. 3, the first thermally actuated element 310 is attached to the first side support beam 306 such that the first thermally actuated element 310 is in contact with the second elongated body 304. Likewise, the second thermally actuated element 312 is attached to the second side support beam 308 such that the second thermally actuated element 312 is also in contact with the second elongated body 304. Upon reaching its preset transition temperature, the thermally actuated elements 310, 312 apply a force to the second elongated body 304 causing the PCB retainer 106 to transition from a dis-engaged configuration to an engaged configuration as further discussed below. In some embodiments, the second elongated body 304 can include receiving slots 314, 316.

In many embodiments, the thermally actuated elements can be made of materials that exhibit shape memory (ability to undergo deformation at one temperature, and then recover its original, undeformed shape upon heating above its transition temperature) and/or superelasticity (exhibit relatively large elasticity and at narrow temperature ranges above its transition temperature, an applied stress without further heating can cause the shape to change).

In various embodiments, the thermally actuated elements are made using Nickel Titanium, i.e. Nitinol. However, various materials can be selected exhibiting shape memory and/or superelasiticty. Further, the transition temperature can be selected and set depending on the needs of the specific applications in a manner well known to one of ordinary skill in the art. In many embodiments, a first and second elongated bodies (and side support beams) are made of materials that allow for heat transfer and are thus thermally conductive such as (but not limited to) Aluminum.

In some embodiments, the thermally actuated elements can be replaced by one or more non-thermally actuating elements including (but not limited to) a spring loaded element that applies a force to a second elongated body causing a PCB retainer to transition from a dis-engaged configuration to an engaged configuration as further discussed below. Unlike the thermally actuated elements, the spring loaded element can be made from materials such as (but not limited to) steel or any other non-thermally actuating material. In many embodiments, the spring loaded element can utilize mechanical energy stored to generate the force in a manner well known to one of ordinary skill in the art. In other embodiments, the force applied to a second elongated body may be from various other mechanisms in a manner well known to one of ordinary skill in the art.

Many considerations can impact the design of the PCB retainer. Some important parameters for the thermally actuated element include angle, length, thickness, transition temperature and placement of the thermally actuated element on the PCB retainer. Similarly, the angle, height, and other dimensions of the elongated bodies are some parameters involved in maximizing both heat transfer and locking force of the PCB to the groove of a heat sink. Although specific PCB retainer designs are discussed above with respect to FIG. 3, any of a variety of PCB retainer designs can be utilized in accordance with embodiments of the invention.

Cooperative Sliding Relation

Figure 4:
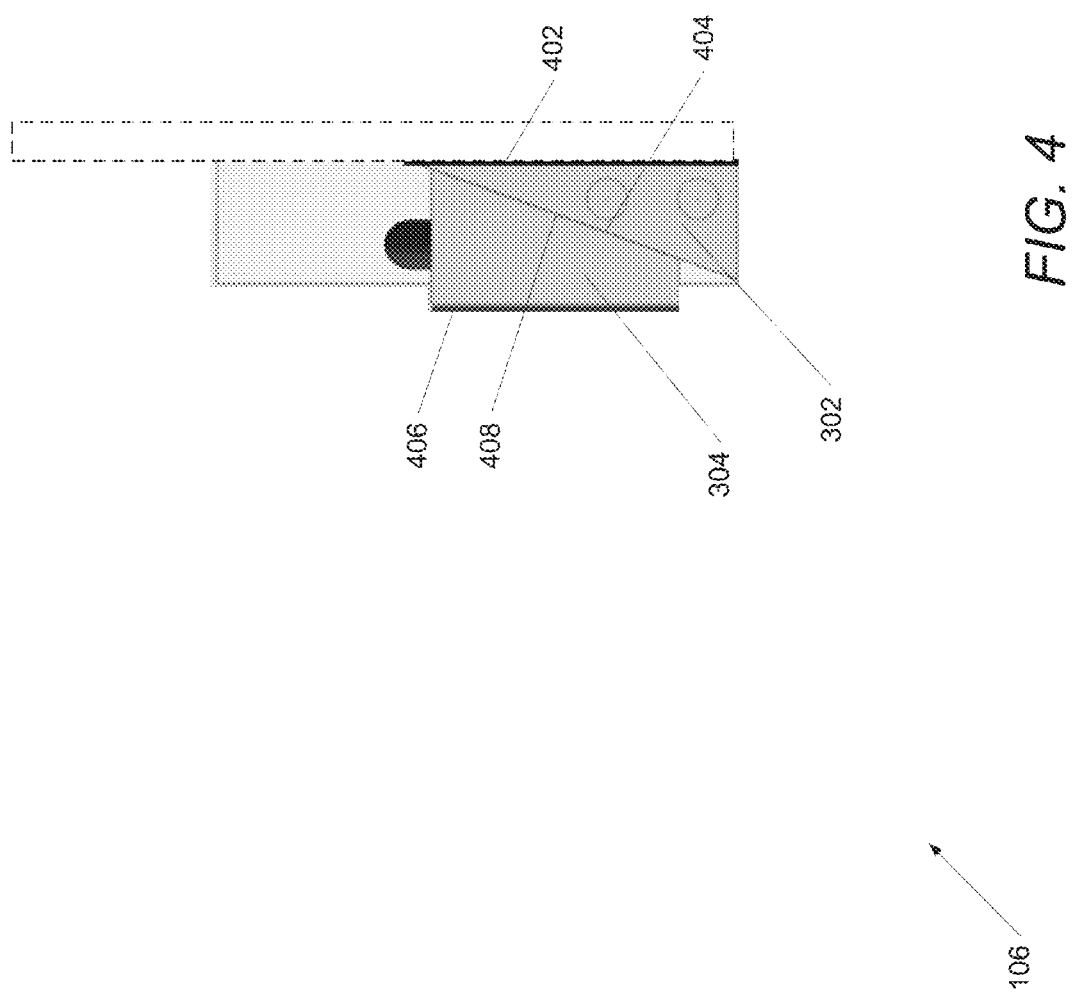
FIG. 4 illustrates a right side perspective view of a PCB retainer with a side support beam removed to expose a pair of complementary elongated bodies in accordance with an embodiment of the invention.

Referring to FIG. 4, a right side perspective view of the PCB retainer 106 with the side support beam removed is illustrated. The first elongated body 302 has a first elongated face 402 and a second elongated face 404 that is opposite the first elongated face where the second elongated face is angled relative to the first elongated face. The PCB retainer 106 also includes a second elongated body 304 that has a first elongated face 406 and a second elongated face 408 that is opposite the first elongated face 406 where the second elongated face is angled relative to the first elongated face. In many embodiments, portions of the second elongated faces 404, 408 of each elongated body stay in contact with each other.

Upon force applied by the thermally actuated elements using a different configuration of one or more thermally actuated elements, the pair of complementary elongated bodies 302 and 304 move in a cooperative sliding relation along the axis created between the contact of the second elongated faces 404, 408 such that movement of the second elongated faces relative to each other causes the first elongated faces of the elongated bodies to move laterally apart.

Figure 5:
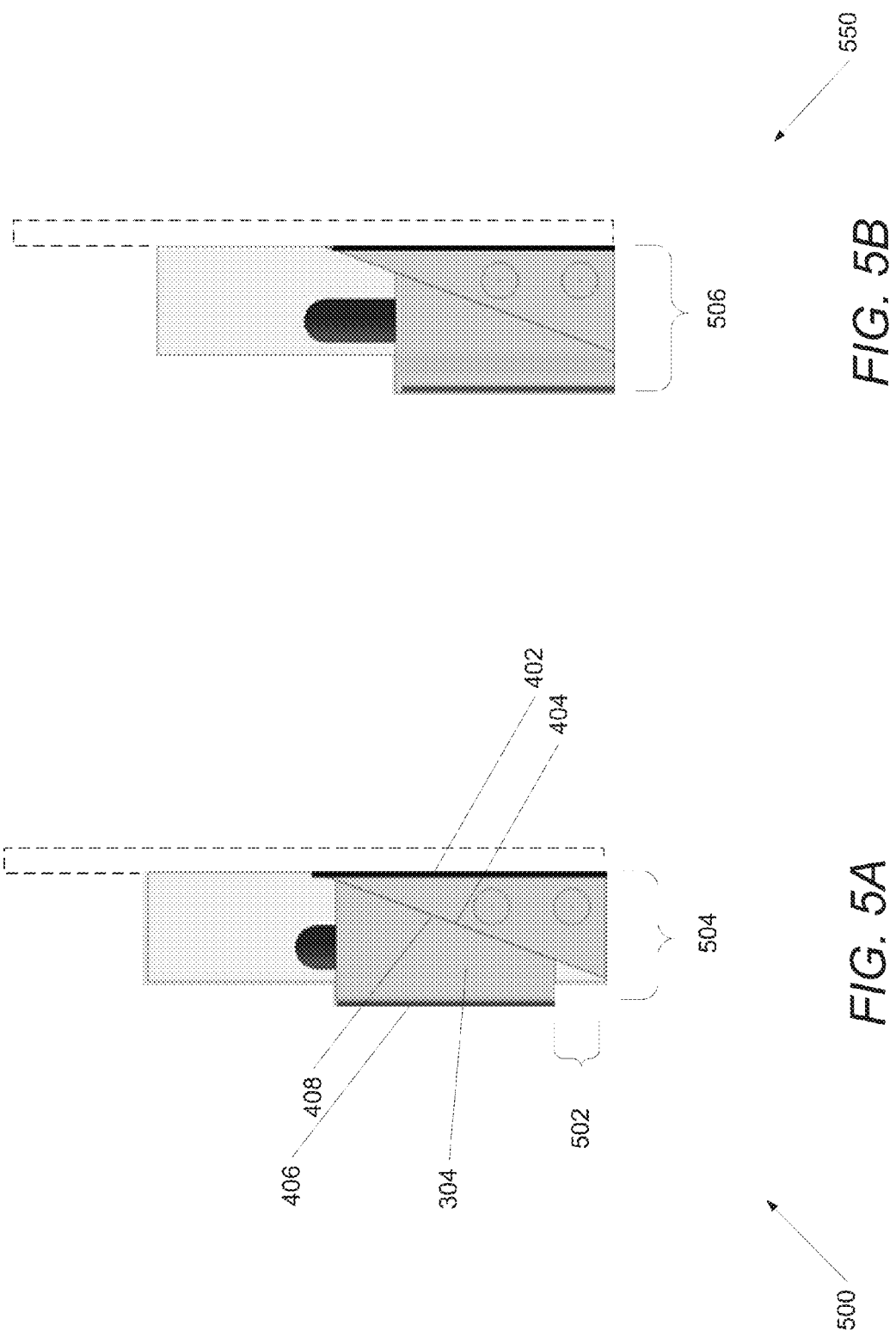
FIGS. 5A-5B illustrate right side perspective views of a PCB retainer in a dis-engaged and engaged configurations, respectively, in accordance with an embodiment of the invention.

FIG. 5A and FIG. 5B, further illustrate the cooperative sliding relation between the pair of complementary elongated bodies 302, 304. Prior to reaching its transition temperature, the thermally activate elements apply relatively less force to the second elongated body 304 and thus the PCB retainer is in the dis-engaged configuration 500. In this configuration, there is a space 502 and a space 504 between the first elongated faces 402, 406 of the first and second elongated bodies. However, when the thermally actuated elements reach their transition temperatures, the thermally actuated elements apply a greater force on the second elongated body 304 such that the second elongated body slides reducing the size of the space 502 and increasing the combined width of the two elongated bodies from 504 to 506 and reducing the available space in the groove (which is not shown). In the latter configuration, the PCB retainer is in the engaged configuration 550. As a result, the increased combined width 506 causes the PCB retainer to take up more of the groove space and consequently secures the PCB to the groove of the heat sink.

Heat Sources and Transition Temperatures

Figure 6:
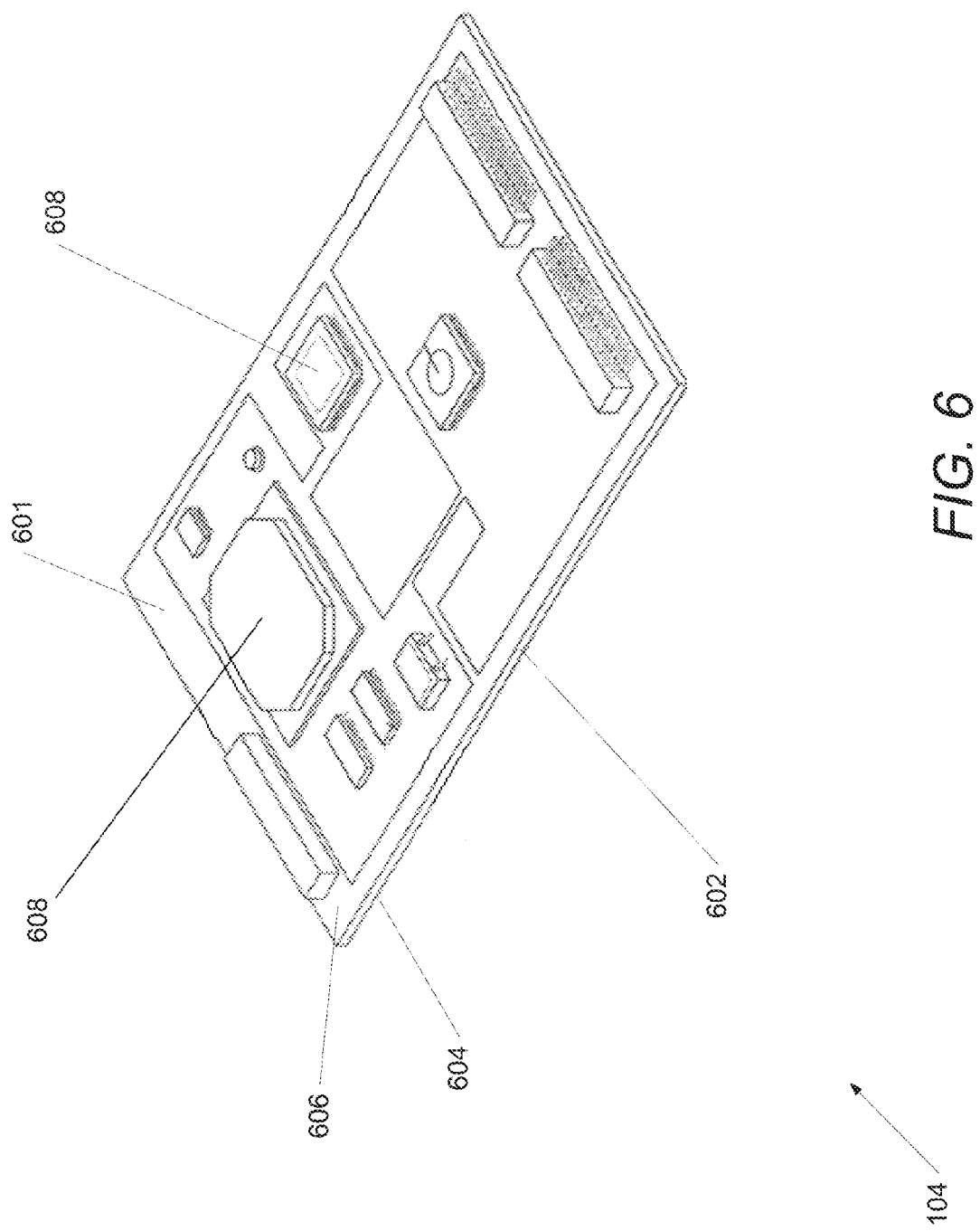
FIG. 6 illustrates a front perspective view of a PCB with mounted electronic components in accordance with an embodiment of the invention.

The thermally actuated elements can reach its transition temperature due to heat generated from the surrounding environment and/or the PCB itself. A PCB including electronic components in accordance with an embodiment of the invention is illustrated in FIG. 6. The PCB 104 includes a non-conductive substrate 601 with a first side 604, a second side 606, and an end 602 that can be inserted into the groove of a heat sink. In many embodiments, the first side 604 is in contact with the first wall 204 of the heat sink. In various embodiments, the second side 606 is in contact with the first elongated face 402 of the first elongated body 302 of the PCB retainer.

In many embodiments, the various electronic components 608 mounted to the substrate 601 generate heat when the electronic components are utilized. In several embodiments, the generated heat is transferred to the substrate 601 that is further transferred to the thermally actuated element via the interface between the PCB and the PCB retainer. In many embodiments, the substrate can use thermally conductive layers including (but not limited to) heavy copper layers and/or layers of carbon fiber to assist with conducting heat away from electronic components mounted on the PCB to the edges of the PCB. Prior to reaching the transition temperature, the thermally actuated elements are in a first position and do not apply enough force to create the cooperative sliding relation as described above. However, upon reaching transition temperature, the thermally actuated elements transition to a second position and apply enough force to create the cooperative sliding relation as described above.

In many embodiments, the thermally actuated elements have a transition temperature set to 30+/−5 degrees Celsius so that the PCB retainer transitions from the dis-engaged to the engaged configuration above a reasonable room temperature, but not high enough to damage the PCB. However, the transition temperature can be set to various temperatures and can be tunable to the particular environment and PCB design. In some applications, the transition temperature can be set above the temperature in the server room and further guided by the temperature difference inside a rack when a PCB is present and when not present. In many embodiments, some residual force is applied even when the thermally activated element has not reached the transition temperature (i.e. in the first position). This force is often enough to hold the PCB in place while still allowing for relatively easy insertion and removal of the PCB from the groove of the heat sink. In many embodiments, the transformation of the thermally activated element is fully reversible and the potential high elasticity of the selected material can reduce the fatigue limit that would be seen with an ordinary metal wire.

PCB Retainer Designs Utilizing a Single Thermally Actuated Element

Figure 7A:
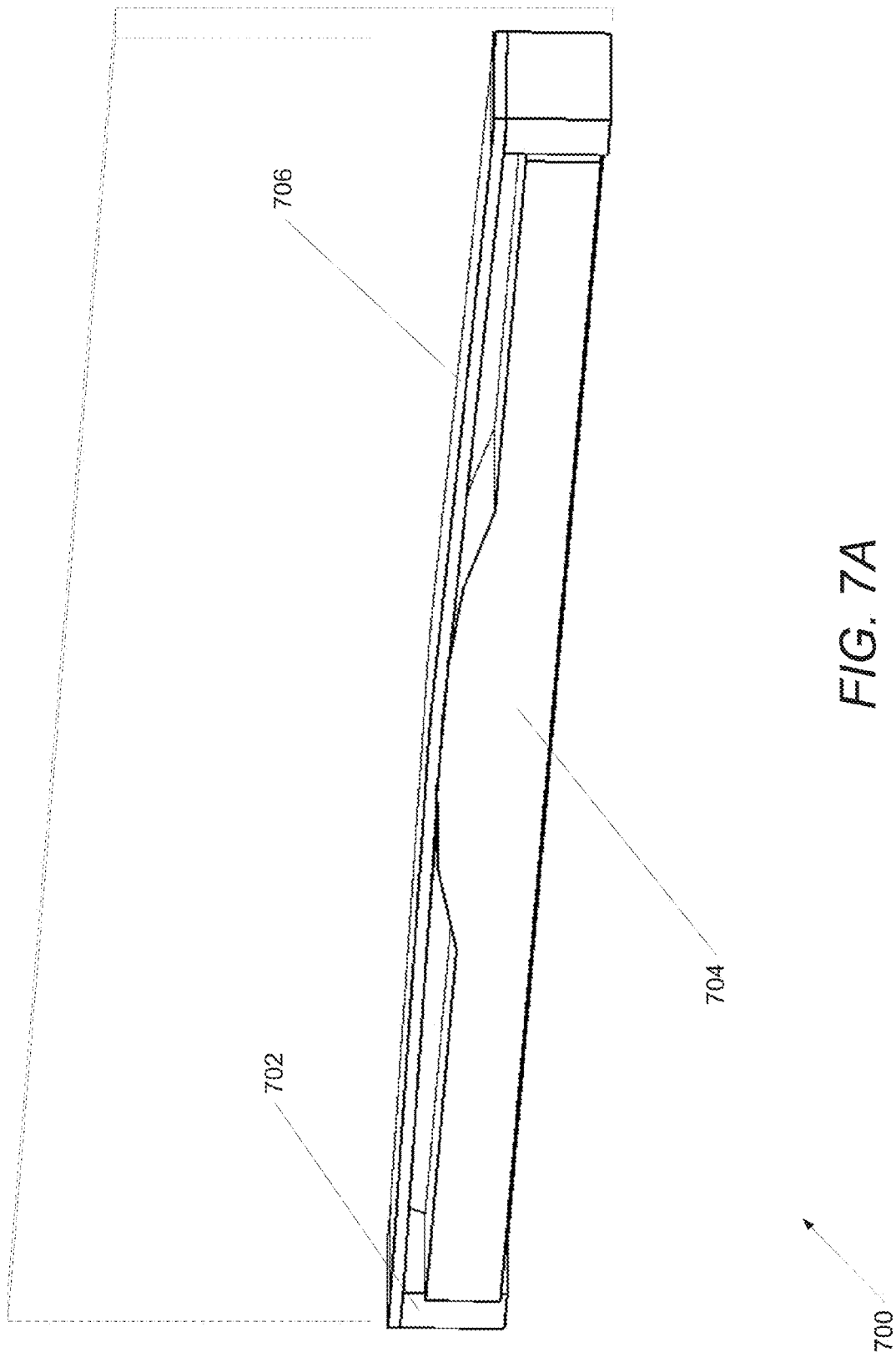
FIG. 7A illustrates a front perspective view of a PCB retainer utilizing a single thermally actuated element in accordance with an embodiment of the invention.
Figure 7B:
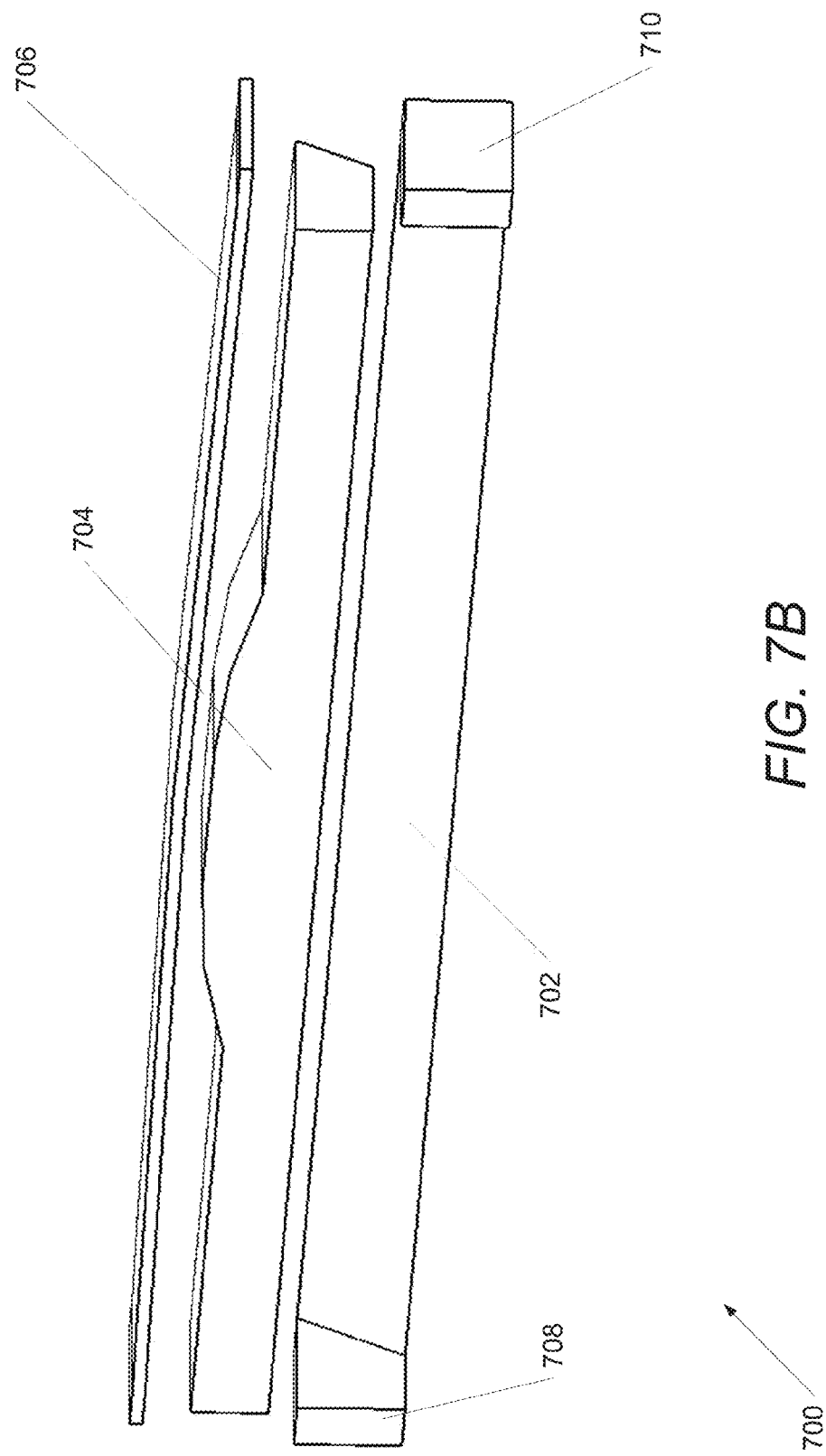
FIG. 7B illustrates an exploded view of a PCB retainer utilizing a single thermally actuated element in accordance with an embodiment of the invention.
Figure 8:
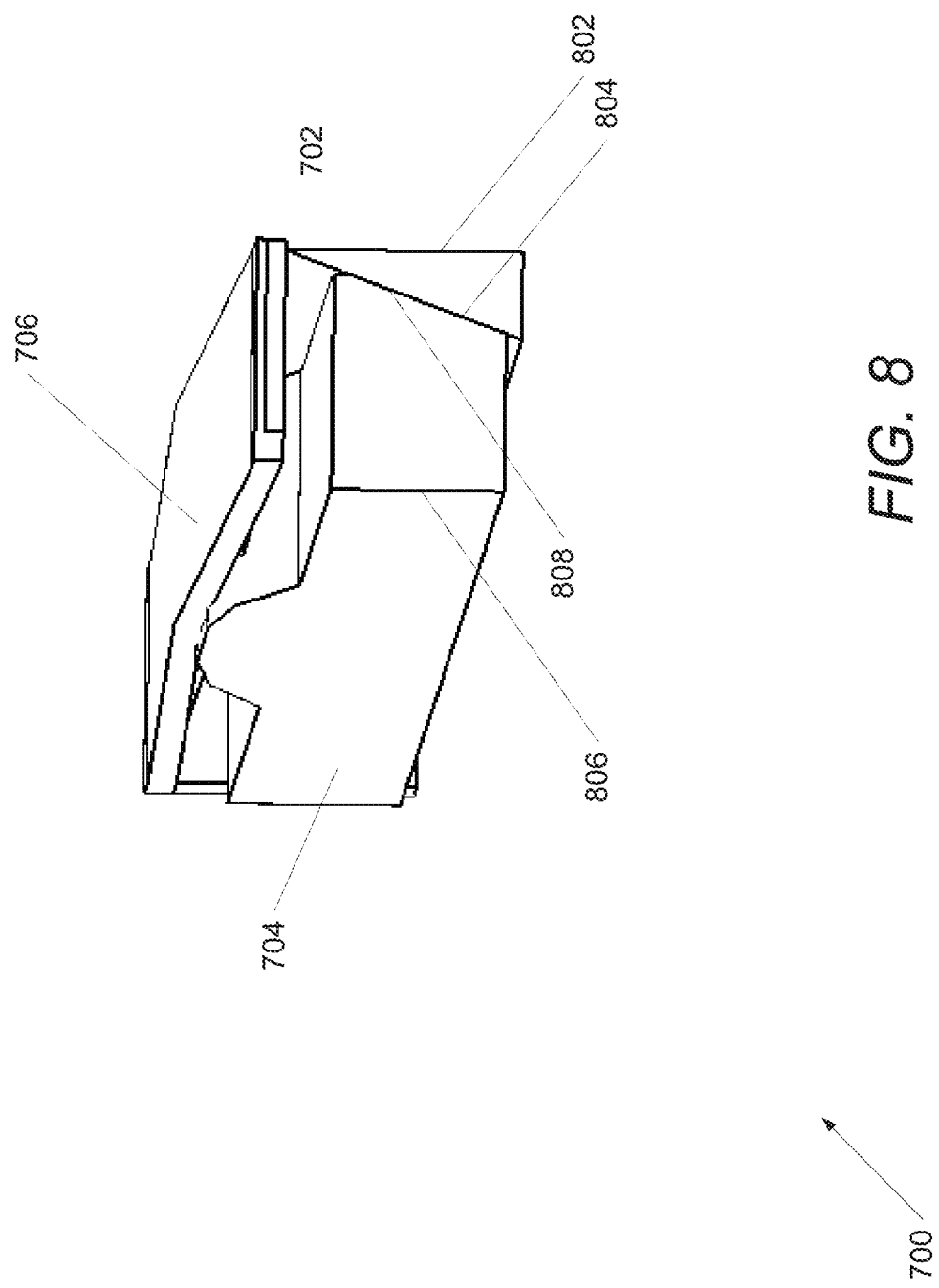
FIG. 8 illustrates a right side perspective view of a PCB retainer utilizing a single thermally actuated element with a side support beam removed to expose a pair of complementary elongated bodies in accordance with an embodiment of the invention.

Although discussed above with reference to a design involving two thermally actuated elements, a PCB retainer can be designed using one or any number of thermally actuated elements. A PCB retainer designed utilizing a single thermally actuated element in accordance with an embodiment of the invention is illustrated in FIGS. 7A-7B and 8. Referring to FIG. 7A, the PCB retainer 700 includes a first elongated body 702, a second elongated body 704, and a single thermally actuated element 706. As further illustrated in FIG. 7B using an exploded view of the PCB retainer 700, the first elongated body 702 includes a first 708 and a second 710 side support beams. Incorporating the side support beams 708, 710 directly into the first elongated body 702 reduces the number of components of the PCB retainer. In many embodiments, the thermally actuated element 706 is in contact with the side support beams 708, 710 and with the second elongated body 704. The second elongated body 704 can be designed such that when the thermally actuated element 706 reaches its transition temperature, force can be readily applied to create the cooperative sliding relation as discussed above between the first 702 and second 704 elongated bodies.

Referring to FIG. 8, a right side perspective view of the PCB retainer 700 with the side support beam 710 removed is illustrated. The first elongated body 702 includes a first elongated face 802 and a second elongated face 804 that is opposite the first elongated face where the second elongated face is angled relative the first elongate face. PCB retainer 700 also includes a second elongated body 704 that has a first elongated face 806 and a second elongated face 808 that is opposite the first elongated face where the second elongated face is angled relative to the first elongated face. In many embodiments, portions of the second elongated faces 804, 808 stay in contact with each other. As discussed above, the PCB retainer has a dis-engaged and engaged configuration depending on whether or not the thermally actuated element is below or above (or equal) to its transition temperature, respectively. The thermally activated element 706 can have various shapes so long as it is able to apply force to the second elongated body 704 to cause the cooperative sliding relation and secure the PCB to the groove of a heat sink as described above. Although specific PCB retainer designs are discussed above with respect to FIGS. 7A-7B and 8, any of a variety of PCB retainer designs can be utilized in accordance with embodiments of the invention.

Although the present invention has been described in certain specific aspects, many additional modifications and variations would be apparent to those skilled in the art. It is therefore to be understood that the present invention may be practiced otherwise than specifically described without departing from the scope and spirit of the present invention. Thus, embodiments of the present invention should be considered in all respects as illustrative and not restrictive. Accordingly, the scope of the invention should be determined not by the embodiments illustrated, but by the appended claims and their equivalents.

What is claimed is:

1. A thermally actuated printed circuit board (PCB) retainer assembly comprising:
   a heat sink having an elongated groove having first and second elongated walls configured to receive a printed circuit board; and
   a printed circuit board retainer comprising:
      a first and second complementary elongated bodies each having a first elongated face and a second elongated face disposed opposite said first elongated face, wherein the second elongated face of each elongated body is angled relative to the first elongated face, wherein the second elongated faces of the elongated bodies are disposed in a cooperative sliding relation such that movement of the second elongated faces relative to each other causes the first elongated faces of the elongated bodies to move laterally apart, wherein the first elongated face of the first elongated body is in contact with the printed circuit board and wherein the first elongated face of the second elongated body is in contact with the second elongated wall of the groove, and at least one thermally actuated element in contact with at least one of the elongated bodies such that heat from the received printed circuit board causes the temperature actuated element to expand and thereby apply a force on the at least one elongated body in response to temperature changes such that the elongated bodies move in the cooperative sliding relation thereby securing the printed circuit board to the heat sink, wherein the first elongated body is constrained such that the applied force does not result in the significant movement of the first elongated body in a direction parallel to the first elongated face.

2. The thermally actuated PCB retainer assembly of claim 1, wherein the heat sink having an elongated groove further includes a third elongated wall.

3. The thermally actuated PCB retainer assembly of claim 1, wherein the PCB retainer includes two thermally actuated elements.

4. The thermally actuated PCB retainer assembly of claim 3, wherein the PCB retainer includes a first and second side support beams.

5. The thermally actuated PCB retainer assembly of claim 4, wherein the first and second side support beams are integral with the first elongated body.

6. The thermally actuated PCB retainer assembly of claim 4, wherein the PCB retainer includes the first and the second side support beams that are separate structures attached to the first elongated body.

7. The thermally actuated PCB retainer assembly of claim 4, wherein, the thermally actuated elements are attached to the side support beams.

8. The thermally actuated PCB retainer assembly of claim 1, wherein the at least one thermally actuated element is made of materials that exhibit shape memory.

9. The thermally actuated PCB retainer assembly of claim 8, wherein the at least one thermally actuated element is made of materials that exhibit superelasticity.

10. The thermally actuated PCB retainer assembly of claim 1, wherein the at least one thermally actuated element is made using Nickel Titanium.

11. The thermally actuated PCB retainer assembly of claim 1, wherein the first and second elongated bodies are made of Aluminum.

12. The thermally actuated PCB retainer assembly of claim 1, wherein the PCB retainer has a dis-engaged configuration when the at least one thermally actuated element is below its transition temperature.

13. The thermally actuated PCB retainer assembly of claim 1, wherein the PCB retainer has an engaged configuration when the at least one thermally actuated element reaches its transition temperature.

14. The thermally actuated PCB retainer assembly of claim 1, further comprising a received PCB wherein the received PCB includes electronic components that generate heat when the electronic components are utilized.

15. The thermally actuated PCB retainer assembly of claim 1, wherein the at least one thermally actuated element has a transition temperature of 30+/−5 degrees Celsius.

16. The thermally actuated PCB retainer assembly of claim 1, wherein the at least one thermally actuated element has a transition temperature greater than 25 degrees Celsius.

17. The thermally actuated PCB retainer assembly of claim 1, wherein the at least one thermally actuated element has a transition temperature greater than 30 degrees Celsius.

18. The thermally actuated PCB retainer assembly of claim 1, wherein the at least one thermally actuated element has a transition temperature greater than 35 degrees Celsius.

19. The thermally actuated PCB retainer assembly of claim 1, wherein the PCB retainer utilizes a single thermally actuated element.

* * * * *

UNITED STATES PATENT AND TRADEMARK OFFICE
CERTIFICATE OF CORRECTION

PATENT NO. : 9,629,232 B2  
APPLICATION NO. : 13/897336  
DATED : April 18, 2017  
INVENTOR(S) : Sean Reilly, Jacob Supowit and Mike Stubblebine Page 1 of 1

It is certified that error appears in the above-identified patent and that said Letters Patent is hereby corrected as shown below:

Column 1, Line 17, remove "this" and replace with --the--.

Signed and Sealed this  
Eighth Day of August, 2017

Joseph Matal  
*Performing the Functions and Duties of the*  
*Under Secretary of Commerce for Intellectual Property and*  
*Director of the United States Patent and Trademark Office*